United States Patent
Shizawa et al.

(10) Patent No.: US 8,245,346 B2
(45) Date of Patent: Aug. 21, 2012

(54) DISC CLEANING MECHANISM AND DISC CLEANING DEVICE

(75) Inventors: Noritake Shizawa, Ashigarakami-gun (JP); Brian Rattray, Ashigarakami-gun (JP)

(73) Assignee: Hitachi High-Technologies Corporation, Tokyo (JP)

( * ) Notice: Subject to any disclaimer, the term of this patent is extended or adjusted under 35 U.S.C. 154(b) by 983 days.

(21) Appl. No.: 12/144,681

(22) Filed: Jun. 24, 2008

(65) Prior Publication Data

US 2008/0313833 A1    Dec. 25, 2008

(30) Foreign Application Priority Data

Jun. 25, 2007    (JP) ................................. 2007-166084

(51) Int. Cl.
*B08B 11/02*    (2006.01)
(52) U.S. Cl. .............................. 15/88.2; 15/88.3; 15/102
(58) Field of Classification Search ................... 15/88.2, 15/88.3, 102
See application file for complete search history.

(56) References Cited

U.S. PATENT DOCUMENTS

| | | | | |
|---|---|---|---|---|
| 5,893,381 A | * | 4/1999 | Terui | .................................. 134/6 |
| 6,618,889 B1 | * | 9/2003 | Terui et al. | ......................... 15/77 |

FOREIGN PATENT DOCUMENTS

| | | |
|---|---|---|
| JP | 9-29188 | 2/1997 |
| JP | 11-129349 | 5/1999 |
| JP | 2007-105624 | 4/2007 |
| JP | 2007-117897 | 5/2007 |

\* cited by examiner

*Primary Examiner* — Randall Chin
(74) *Attorney, Agent, or Firm* — Mattingly & Malur, PC

(57) ABSTRACT

Cleaner liquid flow passages for discharging cleaner liquid from a rotatable brush unit are formed in a rotatable brush unit. The cleaner liquid flow passages are formed as passages wherein the cleaner liquid fed to a hollow portion in a rotary shaft flows to openings in brush cleaner circular plates via lateral grooves provided around the outer circumference of a core roller and along the axial direction. A cleaner liquid fed to discs from a cleaner nozzle contains dirt when the discs are cleaned and the dirt is sucked into the cleaner liquid passages and the dirt is discharged from the rotatable brush unit.

8 Claims, 5 Drawing Sheets

DISC CLEANING MECHANISM AND DISC CLEANING DEVICE

FIELD OF THE INVENTION

The present invention relates to a disc cleaning mechanism and a disc cleaning device, and more specifically, to a disc cleaning device that performs scrub cleaning of discs (circular plates) such as hard discs, wafers and optical discs with circular plate brushes. The present invention relates to a disc cleaning mechanism and a disc cleaning device that through provision of brush cleaner circular plates for cleaning the brushes having cleaner liquid discharge openings, cleaning of the circular plate brushes is performed efficiently together with cleaning of the discs and thereby cleaning efficiency of the discs with the circular plate brushes is enhanced.

BACKGROUND ART

In substrates for hard discs, cleaning of the discs has been performed after the after processes such as grinding, polishing, spattering and plating therefor. For the cleaning of discs such as hard discs and wafers, a plurality of cleaning processes and drying processes after the cleaning are provided. As one of the cleaning processes, scrub cleaning by a scrub cleaning device is exemplified.

As another cleaning process, a device is known in which a carrier (or tray) aligning a plurality of discs vertically thereon is immersed in a bath filled with cleaner liquid and then the discs are cleaned by ultrasonics. In this instance, the drying of the discs after the cleaning is performed after the carrier (or the tray) is transferred to a drying chamber.

In place of such carrier cleaning, a device is known in which conveyers are respectively provided in a shower bath, chemical bath, an ultrasonics bath and a pure water bath, and discs are cleaned by being transferred by the conveyer in the respective baths and successively moved between the respective baths. Further, in this instance, a scrub cleaning device can be disposed prior to the shower bath.

As a scrub cleaning device, JP-A-11-129349 discloses one which cleans discs while catching the discs between adjacent circular plate brushes mounted on a rotary shaft. The device discloses a technology in which many numbers of the circular plate brushes are continuously mounted on the rotary shaft with a gap and assembled as rotatable brushes and the scrub cleaning is performed while catching a part of each disc in the gap between circular plate brushes and rotating the many discs together with the circular plate brushes.

Further, for the brushes in the scrub cleaning, brushes of porous sponge member have been used and the cleaning is performed by contacting the same on the surfaces of rotating discs. In the present specification and claims, the term "brush" of course covers such a sponge member.

The present assignee filed an application relating to a disc cleaning device in which numerous circular plate brushes are continuously mounted and stacked along on the axis of a rotary shaft and scrub cleaning of discs is performed while catching the discs between adjacent circular plate brushes as U.S. patent application Ser. No. 11/548,841, now U.S. Pat. No. 7,841,035 (which corresponds to JP-A-2007-105624, JP-A-2007-117897 and JP-A-2007-289878) and is known in public. This application discloses a technology in which separate from the discs to be cleaned, brush cleaner circular plates for cleaning the brushes are inserted between the circular brushes and the circular brushes are cleaned at the same time when the discs are cleaned.

JP-A-9-29188 discloses a scrub cleaning device in which instead of stacking the circular plate brushes in a rotary shaft, many numbers of pairs of circular plate brushes are provided on a rotary shaft and each opens and closes in the axial direction thereof, and is known in public. In the device, other than shower injecting cleaner liquid to discs, cleaner liquid is flowed through the rotary shaft and the cleaner liquid is fed from the side of the rotary shaft to the circular plate brushes to clean the discs.

In the scrub cleaning device in which many numbers of circular plate brushes are stacked along on the rotary shaft and the discs are cleaned while catching the discs between adjacent circular plate brushes, there arises a problem that dirt is likely to accumulate between the circular plate brushes or dirt is likely to remain on the brushes. For this reason, cleaning of the brushes is necessitated.

In the technology as disclosed in U.S. patent application Ser. No. 11/548,841, now U.S. Pat. No. 7,841,035, the brush cleaner circular plate is provided with holes or slits, is inserted between adjacent circular plate brushes and is rotated together with the discs, whereby cleaning of the circular plate brushes is effected at the same time when the discs are cleaned. However, dirt material or dirt scum caught between the circular plate brushes is hard to remove. The reason for this is thought that since the gap between the circular plate brushes of porous sponge is narrow or both are closely positioned, it is difficult to scrub out the dirt material or the dirt scum, even when the brush cleaner circular plates are inserted therebetween. For this reason, problems arise that the disc cleaning efficiency decreases, parts of brush faces are likely to wear and the exchange frequency of the circular plate brushes increases.

Therefore, it is conceived to clean the circular plate brushes by feeding cleaning liquid to the circular plate brushes from the side of the rotary shaft by making use of the technology disclosed in JP-A-9-29188. However, since it is difficult to open and close the stacked circular plate brushes in the axial direction, even if the cleaning liquid is fed to the circular plate brushes from the side of the rotary shaft, the dirt material or the dirt scum deposited between the circular plate brushes cannot be removed by the cleaner liquid fed to the circular plate brushes from the side of the rotary shaft and cleaning of the circular plate brushes themselves cannot be effected sufficiently.

SUMMARY OF THE INVENTION

An object of the present invention is to solve such problems in the prior art and to provide a disc cleaning mechanism and a disc cleaning device in which in a scrub cleaning of cleaning discs while catching each of the discs between adjacent brushes in a plurality of brushes mounted on a rotary shaft, the cleaning efficiency of the discs by the brushes is enhanced by efficiently cleaning the brushes for cleaning the discs with brush cleaner circular plates.

A feature of a disc cleaning mechanism and a disc cleaning device according to the present invention for achieving such object is, in a scrub cleaning of cleaning discs while catching each of the discs between adjacent brushes in a plurality of brushes mounted on a rotary shaft, to provide a core roller which rotates integrally with the rotary shaft and to which the brushes are mounted. A rotatable brush unit is provided which includes the core roller and in which the plurality of brushes are mounted and stacked on the core roller via central openings of the brushes. Brush cleaner circular plates are provided, with each having openings for cleaning the brushes, which are respectively inserted between the brushes at positions not overlapping with positions between the brushes where the respective discs are inserted and are rotated while the outer circumferences thereof are engaged to the core roller. A cleaning nozzle injecting cleaner liquid for cleaning the discs is provided, wherein the rotary shaft is hollow and lateral grooves are formed around the outer circumference of the core roller along the axial direction of the rotary shaft. Further, the lateral grooves are formed in plural in the circumferential direction and as well the respective plural lateral grooves communicate with the hollow portion of the rotary shaft. When the brush cleaner circular plates are rotated, at least a part of the opening in the brush cleaner circular plates communicates with the lateral grooves and another cleaner liquid fed to the hollow portion in the rotary shaft flows to the openings of the brush cleaner circular plates via the lateral grooves and is discharged from the rotatable brush unit.

As has been explained above, according to the present invention, the cleaner liquid flow passages for discharging the cleaner liquid from the rotatable brush unit are formed in the rotatable brush unit. The cleaner liquid flow passages are formed as passages wherein the cleaner liquid fed to the hollow portion in the rotary shaft flows to the openings in the brush cleaner circular plates via the lateral grooves provided around the outer circumference of the core roller and along the axial direction.

When the brushes and the brush cleaner circular plates are rotating, another cleaner liquid fed to the discs from the cleaner nozzle contains dirt when the discs are cleaned and moves to the outer circumference of the discs according to the centrifugal force of the rotating discs. Since the cleaner liquid in the cleaner liquid flow passages is flowing around the outer circumference of the discs, the cleaner liquid containing the dirt is sucked into the cleaner liquid and the dirt is discharged outside from the rotatable brush unit.

In other words, the cleaner liquid fed to the hollow portion in the rotary shaft flows into the newly formed cleaner liquid passages, and with the synergetic effect of the passages and the centrifugal force of the discs, the dirtied cleaner liquid fed from the cleaner nozzle and having cleaned the discs is discharged outside from the rotatable brush unit.

Accordingly, since dirt material or dirt scum caught between the circular plate brushes are discharged along the newly formed cleaner liquid passages, the cleaning of the circular plate brushes is performed at the same time.

In particular, when circumferential grooves are provided on the core roller so as to engage respectively with the outer circumferences of the discs and of the brush cleaner circular plates, the dirt material or the dirt scum drops into the circumferential grooves through an action of centrifugal force by the discs, the dirt material or the dirt scum can be further easily discharged.

As a result, according to the present invention, the cleaning efficiency of the circular plate brushes for cleaning the discs can be enhanced by the brush cleaner circular plates, whereby the cleaning efficiency of the discs by the circular plate brushes can be enhanced.

DESCRIPTION OF THE PREFERRED EMBODIMENT

Figure 1A:
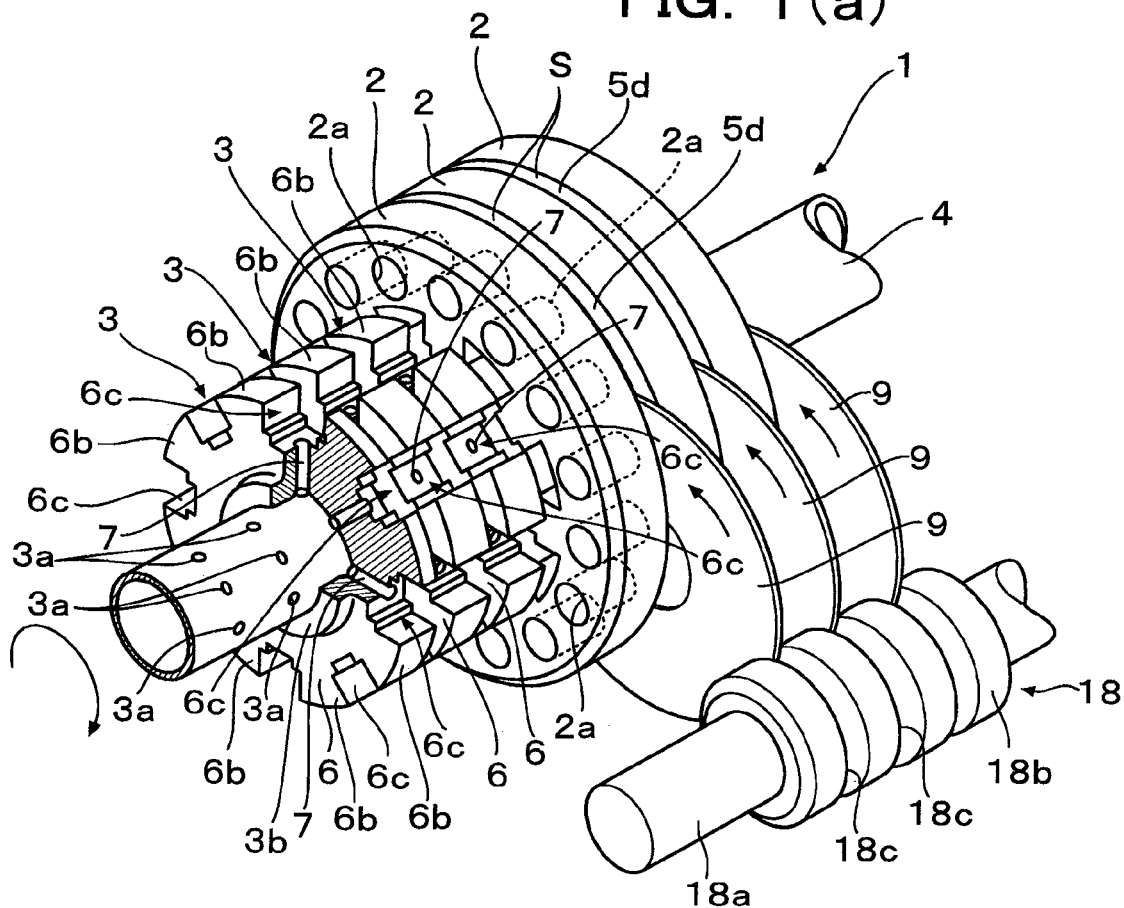
FIG. 1(a) is a partly disassembled partial perspective view of primarily a rotatable brush unit of a disc cleaning mechanism representing one embodiment to which the present invention is applied.

Herein below, in the respective drawings, same constitutional elements are assigned the same reference numerals.

Figure 3:
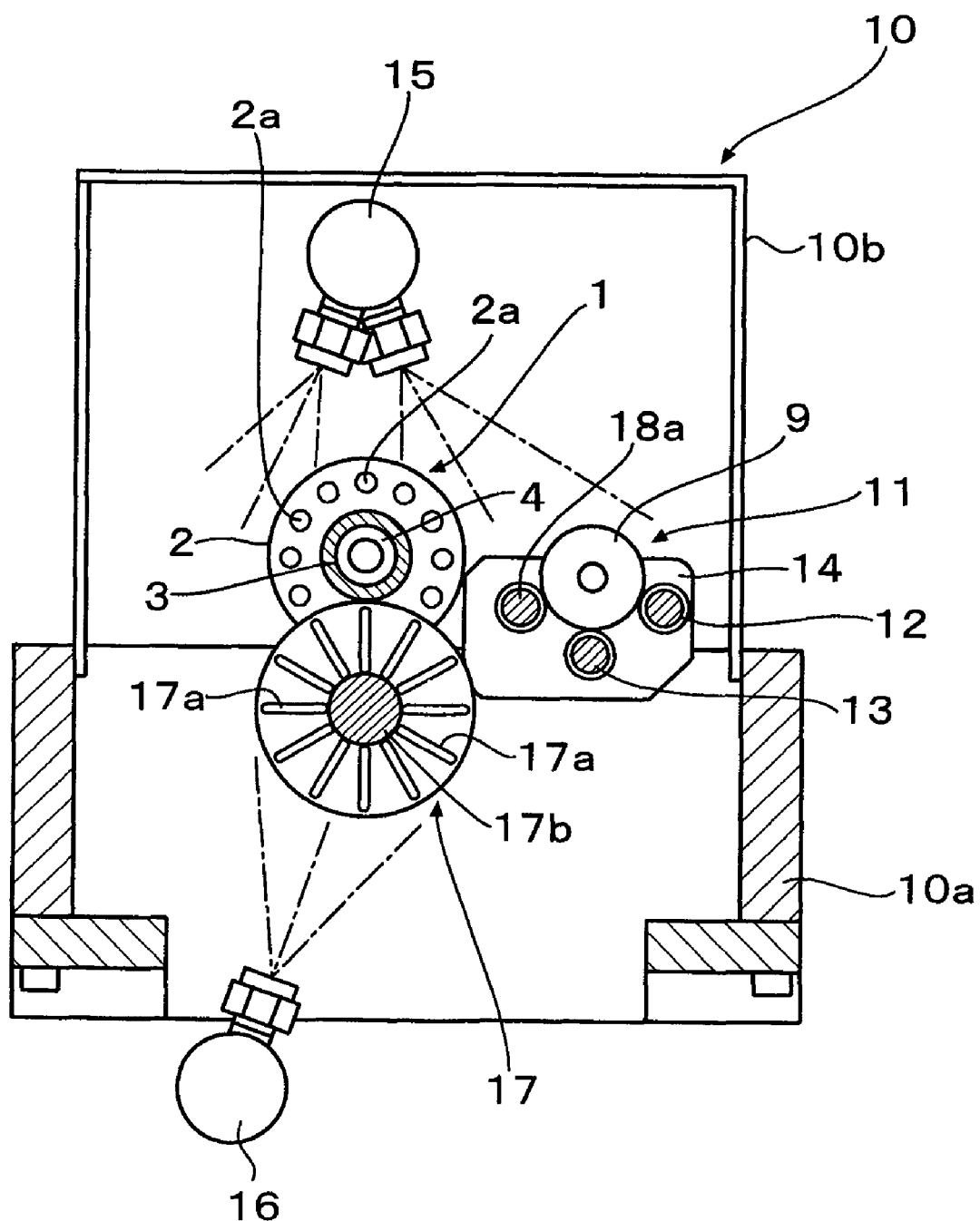
FIG. 3 is a vertically cross sectioned view for explaining the disc cleaning device.

FIG. 3 is a vertically cross sectioned view for explaining a disc cleaning device, reference numeral 10 is a disc cleaning device, 10a is a base housing of the disc cleaning device 10 and 10b is an upper cover of the disc cleaning device 10.

Numeral 1 is a rotatable brush unit and is constituted by circular plate brush (rotatable brush) 2, ring shaped core roller 3 (see FIG. 1(a)) and a hollow shaft 4 to which numerous core rollers 3 are fitted and secured. In the rotatable brush unit 1, passages (as will be explained later) are formed where cleaner liquid flows out from holes 3a (see FIG. 1(a)) bored in the hollow shaft 4 to the core rollers 3. Further, in this embodiment, the many numbers of core rollers 3 and the hollow shaft 4 are integrated and constitute a single roller rotating with the hollow shaft 4 serving as a rotary shaft.

As shown in detail in FIG. 1(a), numerals 2a are through holes provided along the outer circumference of the circular plate brush 2 with an equal interval and passing through the circular plate brush 2 in its axial direction, and in this embodiment, sixteen through holes 2a are provided along the circumferential direction.

In FIG. 3, numeral 9 is a disc to be cleaned, in this embodiment, n (n is an integer of more than 1) pieces of discs 9 are inserted and loaded to the rotatable brush unit 2 and cleaned.

Numeral 11 is a disc inserting and loading mechanism and is constituted by a disc orbital motion preventing roller 18 (see FIG. 1(a)), two disc receiving axes 12 and 13 provided adjacent to an axis 18a of the roller 18 and in parallel therewith and a bracket 14.

Two brackets 14 are provided in back and front and the ends of the disc orbital motion preventing roller 18 are secured to these brackets 14. Further, both ends of the disc receiving axes 12 and 13 are also secured respectively to the brackets 14. As shown in the drawing, the disc 9 is supported by these three axes. Further, the bracket at the front is not seen in the drawing.

The disc inserting and loading mechanism 11 is provided as a disc loader and unloader which inserts and loads at the same time, a plurality of discs 9 to be cleaned into the rotatable unit 1 and receives at the same time a plurality of discs 9 after being cleaned. The loading of the discs 9 by the disc inserting and loading mechanism 11 to the rotatable brush unit 1 is performed by rotating the brackets 14 in anticlockwise direction under a condition that the disc inserting and loading mechanism 11 holds the discs 9. Further, the unloading of the discs 9 is performed by rotating the brackets 14 in anticlockwise direction and receiving discs 9 from the rotatable brush unit 1 in the disc inserting and loading mechanism 11 which is empty of discs. Details of such operations are disclosed in U.S. patent application Ser. No. 11/548,841, now U.S. Pat. No. 7,841,035, referred to above which is incorporated herein by reference.

Figure 4:
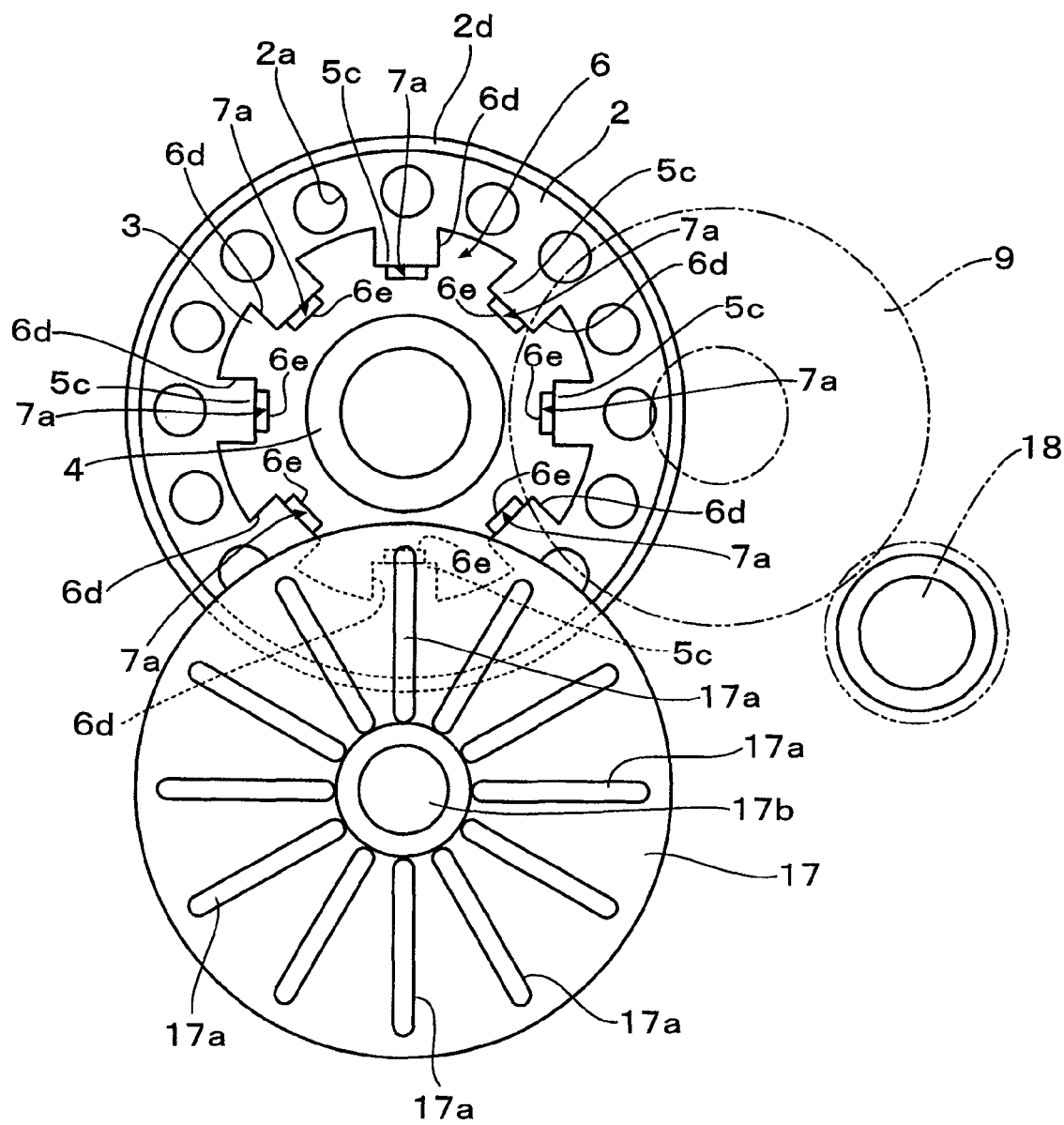
FIG. 4 is a view for explaining a relationship between openings in a brush cleaner circular plate and lateral grooves provided around the outer circumference of a core roller.

Numerals 15 and 16 are cleaner nozzles. 17 is a brush cleaner circular plate for cleaning the brushes (see FIG. 4)

which is inserted from a lower side position corresponding to a position (see contacting portions S in FIG. 1(a)) in the rotatable brush unit 1 where the disc 9 is inserted.

The cleaner nozzle 15 is disposed inside the upper cover 10b above the rotatable brush unit 1 and serves as a nozzle used for cleaning discs 9. The nozzle 16 is a cleaner nozzle for the brush cleaner circular plate 17 disposed at the lower side of the brush cleaner circular plate 17 in the base housing 10a.

The disc cleaning device 10 rotates the hollow shaft 4 in the rotatable brush unit 1 in clockwise direction. When the hollow shaft 4 is rotated in clockwise direction, the outer circumferences of the discs 9 inserted in the respective contacting portions S engage with the core rollers 3 and are caught between circular plate brushes 2 as shown in FIG. 1(a), whereby the discs 9 are revolved around the hollow shaft 4 in clockwise direction in response to the rotation of the circular plate brushes 2 in an anticlockwise direction. The orbital motion of the discs 9 is prevented, when the outer circumferences of the discs 9 engage with a disc orbital motion preventing roller 18. As a result, as shown in FIG. 1(a), the discs 9 are supported by the disc orbital motion preventing roller 18 and the core rollers 3 and are rotated in anticlockwise direction as shown by arrows in response to the rotation of the core rollers 3 and the circular plate brushes 2 in clockwise direction.

Further, the disc orbital motion preventing roller 18 is constituted by mounting a sleeve 18b on an axis 18a, and the discs 9 are rotated by engaging the outer circumference of the discs 9 with circumferential grooves 18c formed on the sleeve 18b.

Figure 1B:
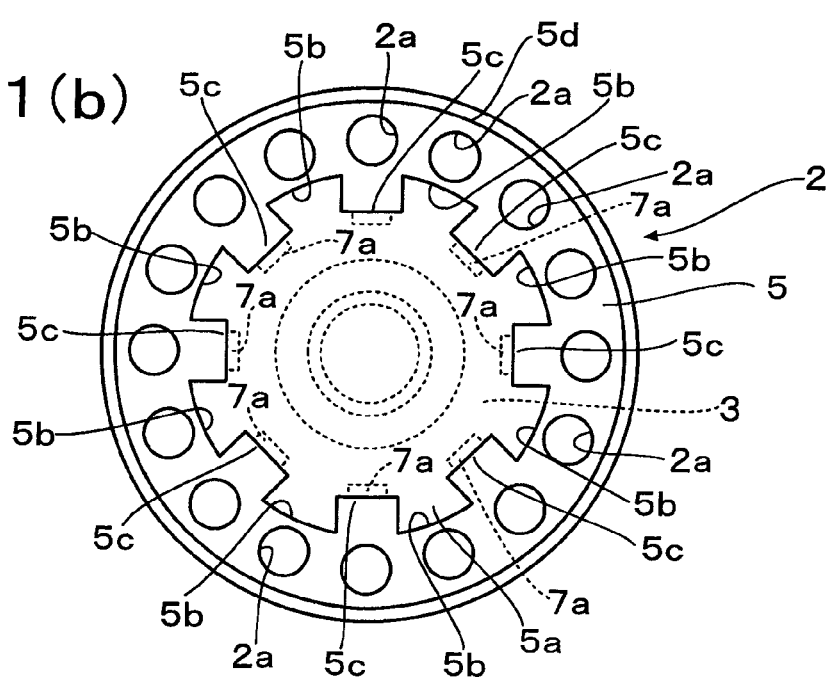
FIG. 1(b) is a view for explaining a circular plate brush therein.

Incidentally, the partly disassembled partial perspective view of FIG. 1(a) shows at the right side of the drawing three pieces of core rollers 3 before disassemblement on each of which the circular plate brush 2 is mounted along the hollow shaft 4 and at the left side thereof three pieces of core rollers 3 under a condition that the circular plate brushes 2 are removed. At the far left end thereof, the hollow shaft 4 under the condition that the core rollers 3 are removed is shown as a partial drawing. Further, FIG. 1(b) shows the circular plate brush 2 mounted on the core roller 3.

As shown in FIG. 4, the brush cleaner circular plate 17 is provided with many radial openings 17a. Corresponding to n (n is an integer more than 1) pieces of discs 9, n pieces of brush cleaner circular plates 17 are fitted to a shaft 17b, and are inserted from the lower side at positions between brushes so as not to overlap with positions between brushes into which the discs 9 are inserted. Thus, in response to the rotation of the circular plate brushes 2 in the rotatable brush unit 1, the brush cleaner circular plates 17 using the shaft 17b as its rotary axis are rotatablly driven at the same time by means of frictional contact with the circular plate brushes 2.

Further, in this instance, the shaft 17b can be driven by an independent motor to rotate the brush cleaner circular plates 17.

Figure 2:
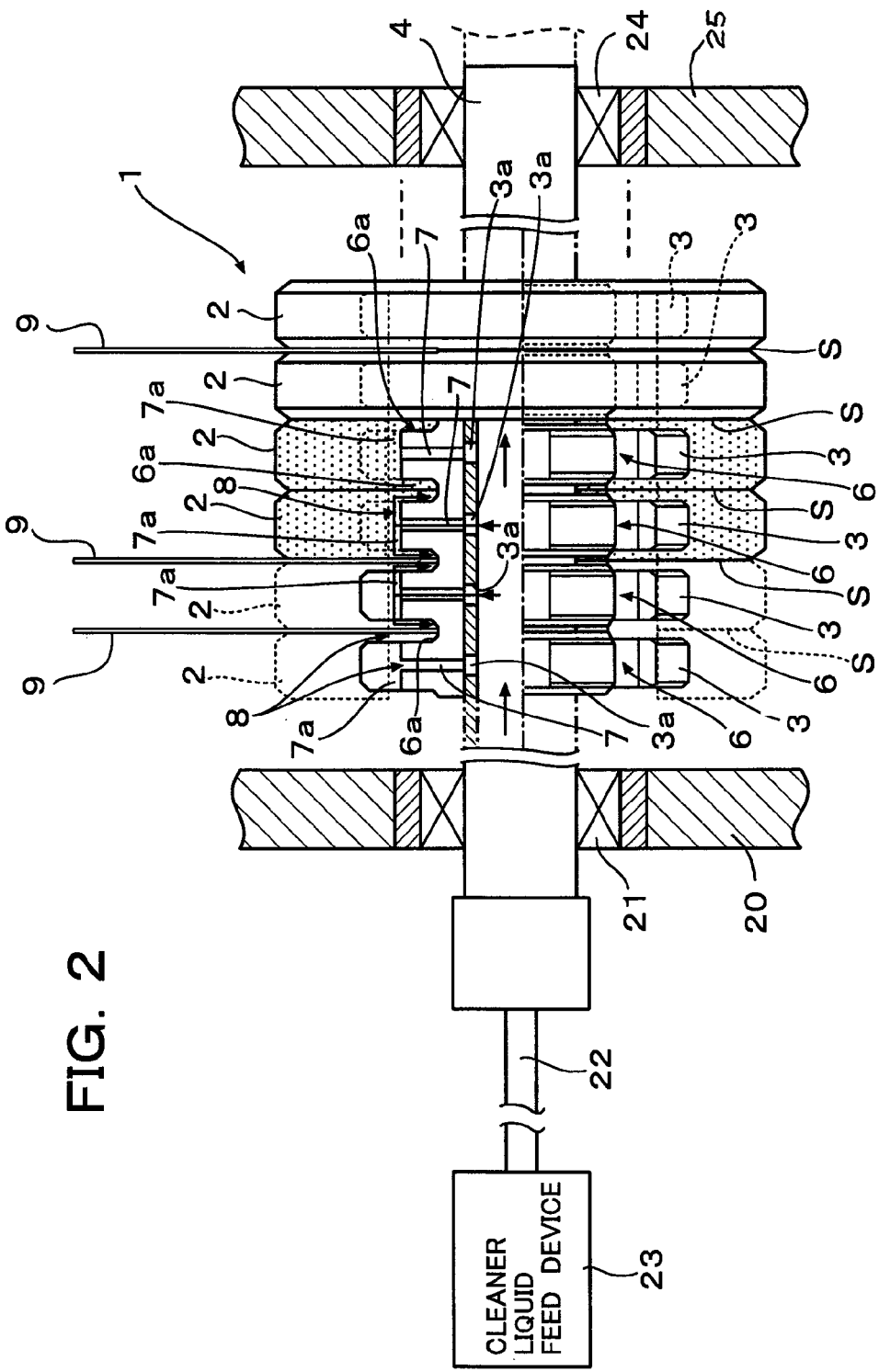
FIG. 2 is a partially cross sectioned view for explaining the rotatable brush unit.

As shown in FIGS. 1(a) and 2, in the rotatable brush unit 1, in order to catch n pieces of discs 9 in n pieces of between brushes, n+1 pieces of circular plate brushes 2 are mounted and stacked on n+1 pieces of core rollers 3. The n+1 pieces of core rollers 3 are inserted onto the hollow shaft 4 and stacked there and secured to the hollow shaft 4. The discs 9 are respectively inserted in the n pieces of contacting portions S formed between brush faces of adjacent circular plate brushes 2 and are held between the adjacent circular plate brushes 2. As seen from the disc 9 shown by a two-dot chain line in FIG. 4, the width from inner diameter to outer diameter of the circular plate brush 2 reaches the center hole of the disc 9.

Both ends of the hollow shaft 4 are threaded, and n+1 pieces of core rollers 3 including those shown in the partially cross sectioned explanatory view of the rotatable brush unit 1 in FIGS. 1(a) and 2 are caught and held from both ends thereof by flanges (not shown) fitted to the threads formed at both ends of the hollow shaft 4, are positioned on the hollow shaft 4 and are fitted and secured to the hollow shaft 4. Thereby, the hollow shaft 4 and the many numbers (n+1) of ring shaped core rollers 3 are integrated to form a single roller.

As shown in the explanatory view of circular plate brush 2 in FIG. 1(b), the circular plate brush 2 is constituted by a perforated sponge circular plate member 5 of PVA (poly vinyl alcohol) provided with a central opening 5a. At the central opening 5a of the perforated sponge circular plate member 5 (herein below will be called as sponge circular plate) eight sections of grooves 5b are formed along the outer circumference of the circular opening (an inner circumference of the sponge circular plate 5) with an equal interval, corresponding to eight protrusions 5c are formed between the respective grooves 5b, and thereby, the sponge circular plate 5 is provided with a concave and convex inner circumference.

The sponge circular plate 5 is provided with a chamfered portion 5d and this chamfered portion 5d creates at the outer circumference of the contact portion S formed between circular plate brushes 2 a valley which facilitates insertion of the disc 9. A thickness of the respective circular plate brushes 2 in its axial direction is, for example, 8~20 mm for a 1.8 inch disc and the diameter thereof is about 60~90 mm.

On one hand, since the n+1 pieces of core rollers 3 are stacked on the hollow shaft 4, n+1 pieces of brush mounting flange portions 6 (herein below will be called as flange portion) are formed continuously with an equal interval on the hollow shaft 4 in the axial direction thereof with respect to the hollow shaft (rotary axis) 4 as shown in FIGS. 1(a), 2 and 4.

Along the outer circumference of n+1 pieces of the respective flange portions 6, eight protrusions 6b which are to be fitted to the eight grooves 5b of the circular plate brushes 2 are formed and between each of the respective eight protrusions 6b, a two stepped groove 6c having a predetermined depth is formed. The stepped grooves 6c extend in their width direction (the axial direction of the hollow shaft 4) and constitute lateral grooves along the axial direction. To higher steps 6d (see FIG. 4) of the stepped grooves 6c, the protrusions 5c of the sponge circular plate 5 are fitted. At lower steps 6e (see FIG. 4) of the stepped grooves 6c, a communication hole 7 (see the cross sectional view of the core roller 3 at the left side in FIG. 1(a)) is bored through the flange portion 6 (the core roller 3) toward the axial center of the hollow shaft 4.

Between the respective flange portions 6, circumferential grooves 6a (see FIG. 2) are formed. At the center portions of the core rollers 3, holes 3a (see FIG. 1(a)) are provided, and the circumferential groove 6a is formed through contact of the mutual bosses 3b of adjacent core rollers 3. Accordingly, the level of the bottom of the circumferential groove 6a is further lower than the lower step 6e of the stepped groove 6c.

As shown in FIGS. 1(a), 1(b) and 4, in the respective circular plate brushes 2 (the sponge circular plate 5), the center opening 5a of the sponge circular plate 5 having the concave and convex inner circumference is fitted to the flange portion 6 having the concave and convex outer circumference and the circular plate brush 2 is mounted on the flange portion 6 in a manner to cover the same.

The width of the flange portion 6 in the axial direction of the hollow shaft 4 is narrower than the width of the circular plate brush 2 in its axial direction as shown in FIG. 2 and the diameter of the flange portion 6 is slightly larger than the central opening 5a of the circular plate brush 2. Accordingly, as shown in FIG. 4, the respective concave and convex portions of the flange portion 6 and the circular plate brush 2 engage, the sponge circular plate member 5 covers the outer circumference of the flange portion 6 and the circular plate brush 2 is fitted to the flange portion 6 under the condition that a part of the stepped groove 6c is not filled.

As shown in FIGS. 1(b), 2 and 4, the protrusion 5c of the sponge circular plate 5 (the circular plate brush 2) is not extended up to the lower step 6e of the stepped groove 6c and with the lower step 6e, a space 7a is formed where the cleaner liquid flows out from the communication hole 7 (see FIG. 1(a)). This space 7a forms a passage where the cleaner liquid flows from the hollow shaft 4 to the core roller 3.

The sponge circular plate 5 as shown in FIG. 1(b) is formed into the circular plate brush 2 as shown in FIG. 4 by mounting the same on the outer circumference of the flange portion 6 via the central opening 5a and assumes the state as shown in FIG. 1(a). Accordingly, the respective circular plate brushes 2 are movable in the axial direction of the core roller 3 (the hollow shaft 4) in response to a predetermined force in the axial direction. Namely, these members constitute a slip kinematic pair (spline) in the axial direction.

For this reason, the depth of the groove 5b used for 1.8 inch disc is, for example, determined as about 3 mm~6 mm, and the diameter of an opening defined by connecting the bottom faces of the grooves 5a of the sponge circular plate 5 (the circular plate brush 2) is smaller by about 10% than an axial diameter defined by connecting the head portions of the protrusions 6b of the core roller 3. Similarly, the diameter of an opening defined by connecting the head portions of the protrusions 5c of the sponge circular plate 5 (the circular plate brush 2) is smaller by about 10% than an axial diameter defined by connecting the bottom faces of the stepped grooves 6c of the flange portion 6 (the core roller 3). The height of the protrusions 6b is about 2 mm~5 mm.

The passage where the cleaner liquid flows from the hollow shaft 4 to the core roller 3 will be explained with reference to the partially cross sectioned explanatory view of the rotatable brush unit 1 as shown in FIGS. 1(a) and 2.

At the left side of FIG. 1(a), the hollow shaft 4 is shown as a partly disassembled partial perspective view. On the hollow shaft 4, holes 3a are bored with a pitch corresponding to the width of the core roller 3 in the axial direction. Further, the holes 3a are also formed in the circumferential direction thereof, in that eight holes are bored in the circumferential direction so as to correspond the respective communication holes 7 to the respective stepped grooves 6c of the flange portion 6 in the respective core rollers 3.

As shown in FIG. 2, the diameter of the communication holes 7 is smaller than that of the holes 3a. Thus, the n+1 pieces of respective core rollers 3 formed by stacking the n+1 pieces of flange portions 6 are mounted on the hollow shaft 4 in such a manner that by coinciding one of the communication holes 7 in the flange portion 6 with one of the holes 3a, all of the remaining 7 pieces of communication holes 7 and the holes 3a in the circumferential direction are coincided.

The coincidence of one of the communication holes 7 with one of the holes 3a is performed by rotating the respective core rollers 3 on the hollow shaft 4 to align any one of the communication holes 7 with corresponding one of the holes 3a and a pin is inserted in the aligned holes for temporary stop, and after mounting n+1 pieces of temporarily stopped core rollers 3 on the hollow shaft 4, the core rollers 3 are fastened by the flanges from both sides of the hollow shaft 4 and secured to the hollow shaft 4. Thereafter, when the pins for the temporary stop are removed, a rotatable roller where cleaner liquid communication passages 8 are formed is easily produced.

As a result, as shown in FIG. 2, the cleaner liquid communication passage 8 running from the hollow shaft 4 to the flange portions 6 and further to the circumferential grooves 6a is formed.

Although not shown in FIG. 3, the base housing 10a is provided with side walls 20 and 25 as shown in FIG. 2 at left and right sides of the device, and these side walls 20 and 25 extend up to the upper cover 10b. As shown in FIG. 2, one end portion of the hollow shaft 4 at the left side of the drawing is supported by a bearing 21 secured to the side wall 20 of the base housing 10a and is connected to a cleaner liquid feed pipe 22. Cleaner liquid from a cleaner liquid feed device 23 is fed to the hollow shaft 4 via the cleaner feed pipe 22. Another end portion of the hollow shaft 4 at the right side of the drawing is supported via a bearing 24 by the side wall 25 of the base housing 10a and is closed and may be connected to a rotary shaft of a motor.

FIG. 4 is a view for explaining a relationship between radial openings 17a of the brush cleaner circular plate 17 and the stepped grooves 6c (the lateral grooves) provided around the outer circumference of the core rollers 3.

As shown in FIG. 4, the top end side located at the outer circumferential side of the radial openings 17a of the brush cleaner circular plate 17 extends beyond the space 7a formed by the lower step 6e of the stepped groove 6c. Thereby, when the brush cleaner circular plate 17 is rotated, the opening 17a and the lower step 6e in the stepped groove 6c communicate with each other at the position of the circumferential groove 6a.

On one hand, the radial opening 17a of the brush cleaner circular plate 17 is positioned to the circumferential groove 6a in response to the rotation of the brush cleaner circular plate 17, and on the other hand, the cleaner liquid flows from the hole 3a of the hollow shaft 4 through the communication hole 7 to the stepped groove 6c to the space 7a in the lower step 6e. As shown in FIGS. 2 and 4, when the radial openings 17a of the brush cleaner circular plates 17 communicate at the position of the circular grooves 6a to form a cleaner liquid communication passage, the cleaner liquid flowed out passes through the cleaner liquid communication passage 8 and flows out to the outside of the rotatable brush unit 1.

Namely, the fed cleaner liquid runs from the hollow shaft 4 to the flange portions 6, and further to the circumferential grooves 6a, while contacting the circular plate brushes 2. The cleaner liquid contacts the outer circumferences of the discs 9. Further, the cleaner liquid is discharged from the circumferential grooves 6a through the openings 17a of the brush cleaner circular plates 17 to the base housing 10a.

The cleaner liquid from the cleaner nozzle 15 flows into sixteen through holes 2a provided in the circular brush 2, and while being distributed and equalized herein, flows from the circular plate brushes 2 along the discs 9 to be cleaned. The cleaner liquid is sucked by the cleaner liquid flowing in the cleaner liquid communication passage 8 and merges thereto. Since the cleaner liquid flowing in the cleaner liquid communication passage 8 constitutes negative pressure flow with respect to the cleaner liquid injected at this moment from the cleaner nozzle 15 to the circular plate brushes 2, the flow serves to suck the injected cleaner liquid. At the same time, since the discs 9 are rotated, the cleaner liquid containing dirt resulting from the cleaning of the discs 9, is sucked by means of the centrifugal force generated by the discs 9, is dropped to the circumferential grooves 6a positioned at the outer circumferences of the discs 9 and is discharged to the outside from the rotatable brush unit 1 via the openings 17a of the brush cleaner circular plates 17.

Figure 5:
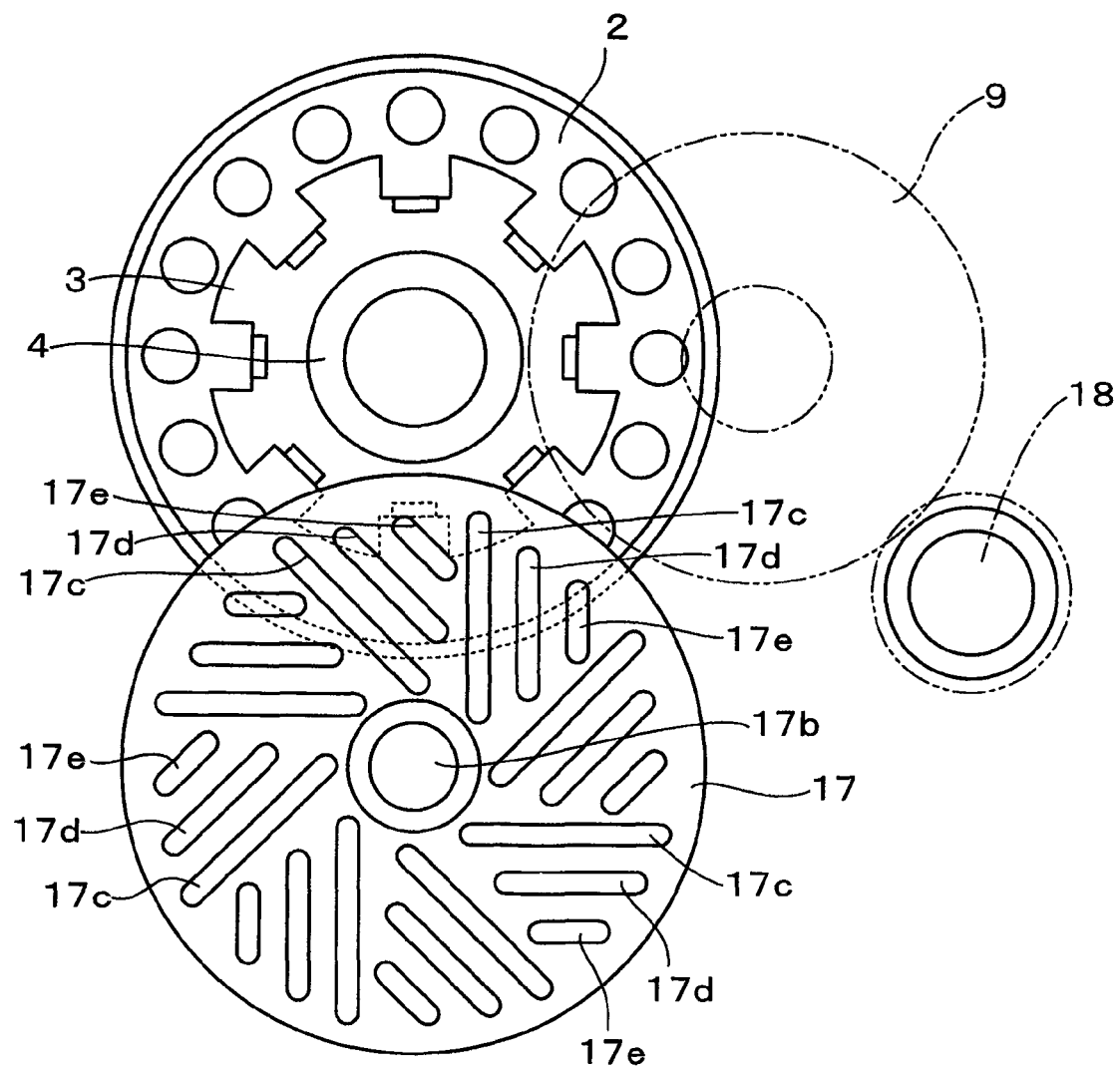
FIG. 5 is a view for explaining openings in a brush cleaner circular plate representing another embodiment for a disc cleaning brush.

FIG. 5 is a view for explaining openings in a brush cleaner circular plate representing another embodiment for a disc cleaning brush.

As shown in FIG. 5, a plurality of openings in the brush cleaner circular plate 17 do not radially extend but are formed in such manner that the plurality of openings communicate with the lower steps 6e (the space 7a) in the stepped grooves 6c at an angle of 45° at the position of the circumferential grooves 6a.

The respective openings assume an angle of about 45° when moved upward during the rotation of the brush cleaner circular plate 17 and are constituted in a form of three slits 17c, 17d and 17e of which the lengths are successively shortened toward the outer circumferential side. As shown in FIG. 5, the three slits 17c, 17d and 17e are arranged in parallel so that the same are contained in a triangle having inclinations of 45° wherein the longer width slit 17c is disposed on the base side thereof and the shorter width slit 17e is disposed on the apex side thereof. Further, eight groups of three slits 17c, 17d and 17e each constituting the triangle are respectively arranged over the entire surface of the brush cleaner circular plate 17 with an equal interval and an equal angle so that the respective groups assume positions in a point symmetry with respect to the rotation center of the hollow shaft 4.

These plurality of slits cross through the rotation with the lower steps 6e (the space 7a) in the stepped grooves 6c in the inclination state of 45° at the circumferential grooves 6a. Thereby, the flow of the cleaner liquid fed to the hollow shaft 4 easily merges with the flow of the cleaner liquid injected from the cleaner nozzle 15 to the circular plate brushes 2. Further, the inclination angle of the respective openings is not limited to 45°.

As has been explained above, in the embodiments, although the circular plate brushes of thin thickness are mounted on the core rollers, in the present invention, other than such circular plate brushes, cylindrical brushes of further thick thickness can of course be mounted on the core rollers.

Further, the core rollers in the embodiments are assembled into a single roller by stacking n+1 pieces of the respective divided and individual ring rollers. However, in the present invention, a single roller can be provided from the original on the rotary shaft and thereafter many numbers of flange portions 6 can be continuously formed on the single roller with a predetermined interval.

Further, although the brushes in the embodiments use a sponge member, the brushes according to the present invention are not limited to the sponge members.

Still further, in the embodiments, although the discs are inserted and loaded in the contacting portions S formed between adjacent back and forth brush faces, the present invention can use a structure wherein in place of the contacting portions S, gaps are provided between the respective adjacent brushes, and after inserting and loading a plurality of discs in the respective gaps, the gaps are closed to push the respective brushes onto the respective discs.

The invention claimed is:

1. A disc cleaning mechanism which performs scrub cleaning of discs while rotating a rotary shaft on which a plurality of circular plate brushes are mounted and each of the discs is positioned between adjacent brushes, comprising:
   a hollow rotary shaft;
   a core roller which is mounted on and which rotates integrally with the rotary shaft and to which a plurality of circular plate brushes are mounted;
   a rotatable brush unit which includes the core roller and in which the plurality of brushes are mounted and stacked on the core roller via central openings of the brushes;
   brush cleaner circular plates, each having openings for cleaning the brushes, said plates being respectively inserted between the brushes at positions which do not overlap with positions between the brushes where the respective discs are inserted and are rotated through engagement of the outer circumferences thereof with the core roller; and
   a cleaner nozzle injecting cleaner liquid for cleaning the discs; and
   wherein a plurality of lateral grooves are formed around the outer circumference of the core roller along the axial direction of the rotary shaft, each of the grooves communicating with the hollow portion of the rotary shaft, whereby when the brush cleaner circular plates are rotated, the respective openings of the brush cleaner circular plates communicate with the lateral grooves and cleaner liquid fed to the hollow portion in the rotary shaft flows to the openings of the brush cleaner circular plates via the lateral grooves and is discharged from the rotatable brush unit.

2. A disc cleaning mechanism according to claim 1, wherein the brushes are circular plate brushes, and the core roller is provided with holes extending inwardly to the rotary shaft for communicating the lateral grooves and the hollow portion of the rotary shaft.

3. A disc cleaning mechanism according to claim 2, wherein the core roller has a plurality of brush mounting flange portions formed thereon extending in the axial direction of the rotary shaft at equal intervals, the width of a brush mounting flange portion in the axial direction being smaller than the width of a brush, and wherein each of the brushes is mounted on the brush mounting flange portions.

4. A disc cleaning mechanism according to claim 3, wherein the lateral groove is a two stepped groove having a high step and a low step, and the hole for communication is bored in the low step.

5. A disc cleaning mechanism according to claim 4, wherein an inner circumference defining a central opening of each brush is formed in a concave and convex configuration, each opening of the brush cleaner circular plate is a slit, and between each of the adjacent brush mounting flange portions a circumferential groove is provided corresponding to a position where the disc is inserted and wherein the outer circumference of the disc and the outer circumference of the brush cleaner circular plate engage with the circumferential groove.

6. A disc cleaning mechanism according to claim 5, wherein the lateral grooves in the outer circumference of the core roller form a concave and convex configuration in the circumferential direction corresponding to the concave and convex configuration on the inner circumference of the brush, and on the outer circumferential portion of the brush through holes are provided at equal intervals extending in the axial direction.

7. A disc cleaning mechanism according to claim 2, wherein the core roller is comprised of a plurality of ring shaped rollers.

8. A disc cleaning device provided with the disc cleaning mechanism according to claim 1.

* * * * *